(12) United States Patent
Maher et al.

(10) Patent No.: US 8,193,834 B2
(45) Date of Patent: Jun. 5, 2012

(54) MULTIPLE DETECTION CIRCUIT FOR ACCESSORY JACKS

(75) Inventors: Gregory Maher, Cape Elizabeth, ME (US); Brewster Porcella, Biddeford, ME (US); Hrvoje Jasa, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 303 days.

(21) Appl. No.: 12/705,183

(22) Filed: Feb. 12, 2010

(65) Prior Publication Data

US 2011/0199123 A1    Aug. 18, 2011

(51) Int. Cl.
    *H03K 5/00*    (2006.01)
(52) U.S. Cl. .......................................... 327/50; 327/524
(58) Field of Classification Search .................... 327/50, 327/72–74, 77, 87, 524, 590
    See application file for complete search history.

(56) References Cited

U.S. PATENT DOCUMENTS

| | | | |
|---|---|---|---|
| 5,754,552 A * | 5/1998 | Allmond et al. | 370/465 |
| 7,053,598 B2 * | 5/2006 | Shieh et al. | 324/66 |
| 7,565,458 B2 | 7/2009 | Thijssen et al. | |
| 8,064,613 B1 * | 11/2011 | Helfrich | 381/74 |
| 2010/0173673 A1 * | 7/2010 | Lydon | 455/557 |
| 2010/0199112 A1 * | 8/2010 | Yokota et al. | 713/300 |

* cited by examiner

*Primary Examiner* — Lincoln Donovan
*Assistant Examiner* — William Hernandez
(74) *Attorney, Agent, or Firm* — Schwegman, Lundberg, & Woessner, P.A.

(57) ABSTRACT

This document discusses, among other things, a multiple accessory detection apparatus and methods for identifying accessories coupled to a multi-pin connector of an electronic device. The apparatus can include a first reference generator, a second reference generator, a plurality of switches to couple an output of the second generator to an accessory device and a comparator. The comparator can generate identifying information about the accessory device using the reference information received from the first reference generator and test information received using the second reference generator.

24 Claims, 9 Drawing Sheets

MULTIPLE DETECTION CIRCUIT FOR ACCESSORY JACKS

BACKGROUND

Since the discovery of electricity and the innovations to control it, electronic devices have evolved to affect all aspects of modern life. Recently, innovations in electronics have enabled electronic devices to perform a variety of tasks. In some situations, the electronics can connect to many different accessory devices to provide and exchange information to the user of the electronic device. As the devices have evolved, portability and mobility have pushed manufactures to produce smaller and smaller devices. This reduction in size has limited the number of physical connectors each device can accommodate, and thus limits the number and or type of accessory devices available for use with the devices.

OVERVIEW

This document discusses, among other things, apparatus and methods for detecting accessory devices coupled to an electronic device. The apparatus can include a first reference generator to provide reference information to a comparator circuit of a multiple accessory detection apparatus, a second reference generator can selectively provide a test signal to an accessory device coupled to the electronic device using a multi-pin connector. The test signal can provide test information to the comparator circuit. The comparator circuit can use the reference information and test information to generate comparator information indicative of multiple electrical characteristics of the accessory device. A controller can use the comparator information to identify and configure electronics associated with the multi-pin connector to properly interface with the identified accessory device.

The examples provided herein can be combined in any permutation or combination. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

Figure 1:
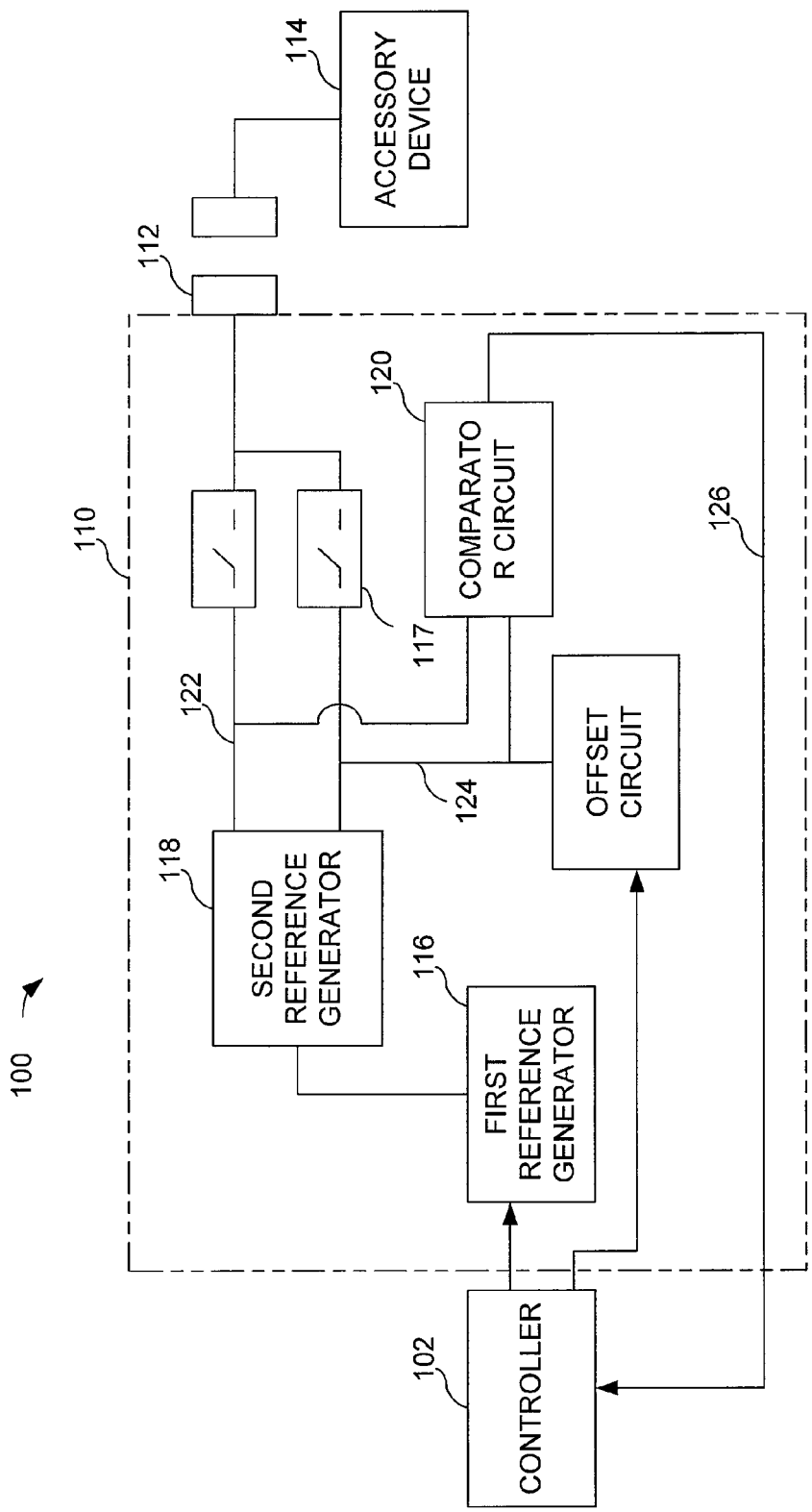
FIG. 1 illustrates generally a block diagram of a multiple accessory jack detection apparatus according to one example of the present subject matter.

Electronic devices such as media players are capable of doing more than playing music. Some media players can play videos, can receive and store information, can run applications, can access wired and wireless networks or combinations thereof. For portable media players, size constraints can limit the ability to connect accessories to enhance or make full use of all the functions the device is capable to perform. The present inventors have recognized, among other things, that methods and apparatus can be used to detect different accessory devices connected to a single connector of an electronic device, such as a portable media player, for example. In various examples, the detection apparatus can detect multiple pin-to-pin relationships of the accessory device using a single interface. In such embodiments, the detection circuit can also detect multiple electrical conditions of a single pin. A multiple detection circuit according to the present subject matter can reduce a number of special purpose detectors, thus providing savings in reducing overall component counts. FIG. 1 shows a block diagram of electronic device with an apparatus for detecting multiple electrical characteristics of a connected accessory device. The electronic device 100 includes, among other things, a multiple accessory detection apparatus 110 for an accessory connector 112 of the electronic device 100. The detection apparatus 110 performs one or more detection routines to determine if an accessory device 114 is connected to the electronic device 100 and if so, the type of accessory device. Upon detection, a controller 102 of the electronic device 100 can configure electronics (not shown) associated with the connector to properly interface with the component of the accessory device 114. In various examples, the controller 102 can be a dedicated controller of the detection apparatus 110. In some examples, the controller 102 can be a controller of the electronic device 100.

With reference to FIG. 1, a multiple accessory detection apparatus 110 according to the present subject matter can include a first reference generator 116, a second reference generator 118, a first plurality of switches 117 coupled to a multi-pin connector 112 of the electronic device 100, and a comparator circuit 120. The first reference generator 116 provides various reference signals for each of the detection methods described below. In some methods, the reference signal generated by the first reference generator 116 can provide a reference signal 122 to a first input of the comparator circuit 120. The output signal of the first reference generator 116 can be shaped over time such that if a speaker, such as for an earphone, is connected to the electronic device 100, application of the reference signal to the accessory device will not generate an audible "click" or "pop" sound to the user's ear while the multiple accessory detection apparatus 110 is detecting the accessory device.

The second reference generator 118 can be coupled between a voltage supply $V_{dd}$ and a reference plane or system ground of the electronic device 100. An output of the second reference generator 118 can be coupled to a second input of the comparator circuit 120. In some detection methods, the signal generated from the second reference generator 118 can be coupled to a pin of the multi pin connector 112 through the first plurality of switches 116. In various examples, the second reference generator supplies current needed to maintain the reference signal 122 and includes a current mirror to generate an output, or test signal 124, of the second reference generator 118. In some examples, the test signal 124 is affected by the accessory device 114 connected to the multi-pin connector 112. The effect of the accessory device can be detected by comparing the reference signal 122 to the test signal 124 at the comparator circuit 120.

In an example, the comparator circuit 120 can receive the reference signal 122 and test signal 124 at a first and second input. An output 126 of the comparator can provide information about the accessory device 114 coupled to the multi-pin connector 112. The information can include, but is not limited to, information about floating pins of the accessory device, shorted pins of the accessory device, impedances of the accessory device, diode location and polarity of the accessory device and one or more states of an operator control accessory device. The information from the comparator circuit can be used to identify the accessory device 114 and configure the electronics (not shown) associated with the multi-pin connector 112 of the electronic device 100 to properly interface with the accessory device 114.

Figure 2A:
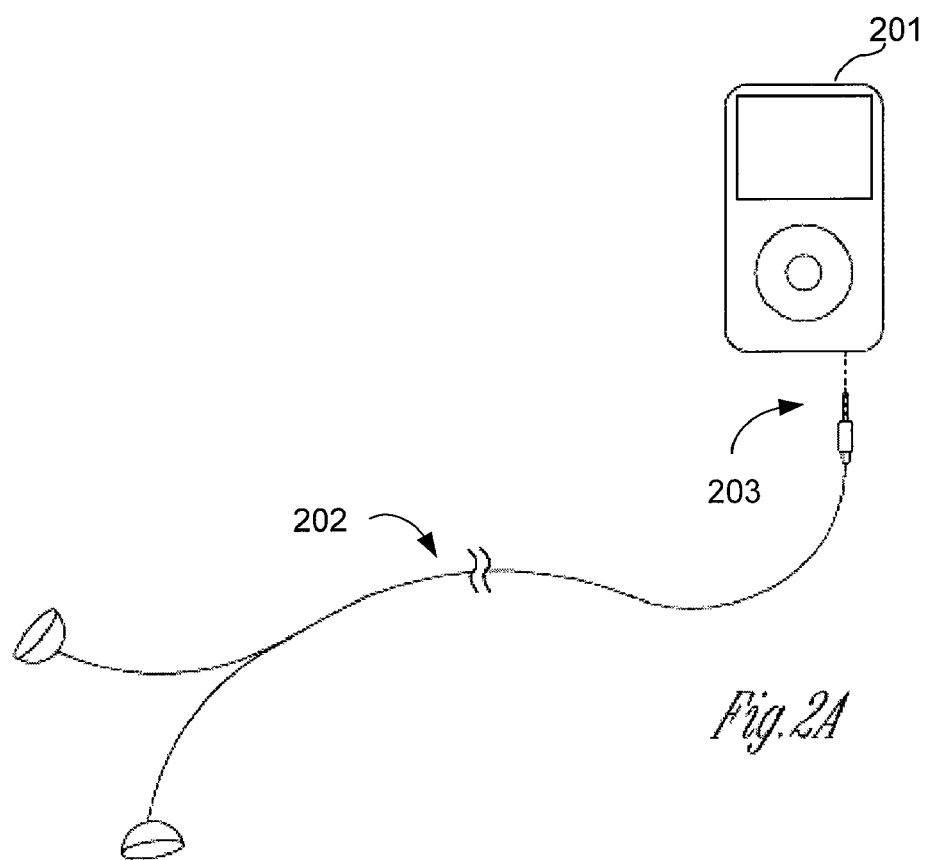
FIGS. 2A and 2B illustrate generally systems using a multiple accessory jack detection apparatus according to one example of the present subject matter.
Figure 2B:
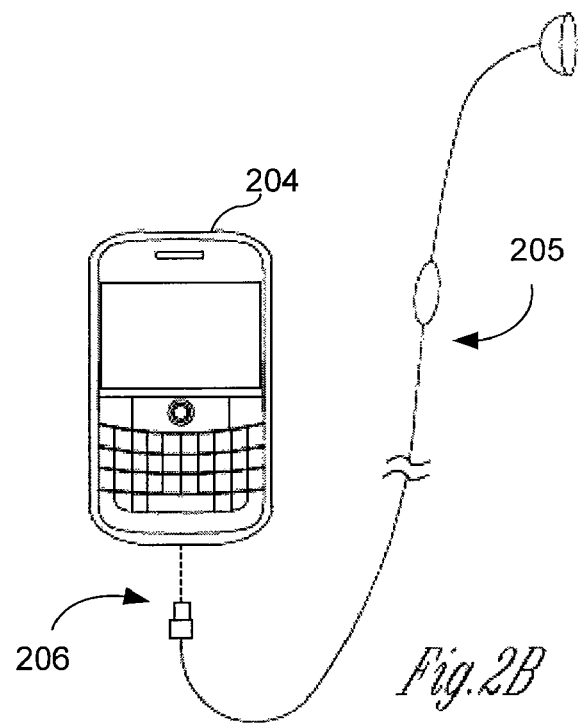

FIGS. 2A and 2B illustrate generally systems using a multiple accessory detection apparatus according to an example of the present subject matter. FIG. 2A illustrates a mobile media player 201 and an earphone accessory device 202 configured to plug into the mobile media player using a tip-ring-sleeve (TRS) connector 203. Such connectors provide various connection contacts about the round shaft of the connector. 3.5 mm TPS connectors are currently used on a wide range of electronic devices including, but not limited to, media players, stereos, televisions, game systems, cellular phone, and personal digital assistants (PDAs). TPS connectors are available in many different sizes, contact configurations and contact quantities. A multiple accessory detection apparatus according to the present subject matter can perform a series of detection functions through the contacts, or pins, of the accessory device 202 to allow identification of the device as an earphone device. A controller, either of the media player or the detection apparatus, can then configure the connector electronics to output audio signals to the proper contacts of the earphone device. During detection and identification of the accessory device, the detection apparatus can limit the frequency of a reference signal applied to each pin of the accessory connector such that if a user has the earphone device in their ear, the reference signal will not project an audible "click" or "pop" to the user's ear. Such a noise can be uncomfortable and annoying for a user.

FIG. 2B illustrates generally a cellular phone 204 and a combination microphone/earpiece accessory device 205 configured to connect to the cellular phone 204. In an example, the cellular phone 204 includes a multiple accessory detection apparatus according to one example of the present subject matter. The multiple accessory detection apparatus can perform a series of detection functions through the contacts, or pins, of the accessory device connector 206 to allow identification of the device as a combination microphone/earpiece accessory device. A controller, either of the cellular phone or the detection apparatus, can then configure the connector electronics to output audio signals to the earpiece and power and receive audio signals from the microphone. During detection and identification of the accessory device, the detection apparatus can limit the frequency of a reference signal applied to each pin of the accessory connector such that if a user has the earphone device in their ear, the reference signal will not project an audible "click" or "pop" to the user's ear. FIG. 2B illustrates the cellular telephone connecting to the accessory device using a mini-Universal Serial Bus (USB) connector 206. It is understood that other style multi-pin connectors are possible to use with a multiple accessory detection apparatus without departing from the scope of the present subject matter including, but not limited to, USB connectors, including mini- and micro-USB connectors, TPS connectors, multi-pin round connectors, modular jack type connectors, including registered jack (RJ) type connectors, and D-shell connectors.

Figure 3:
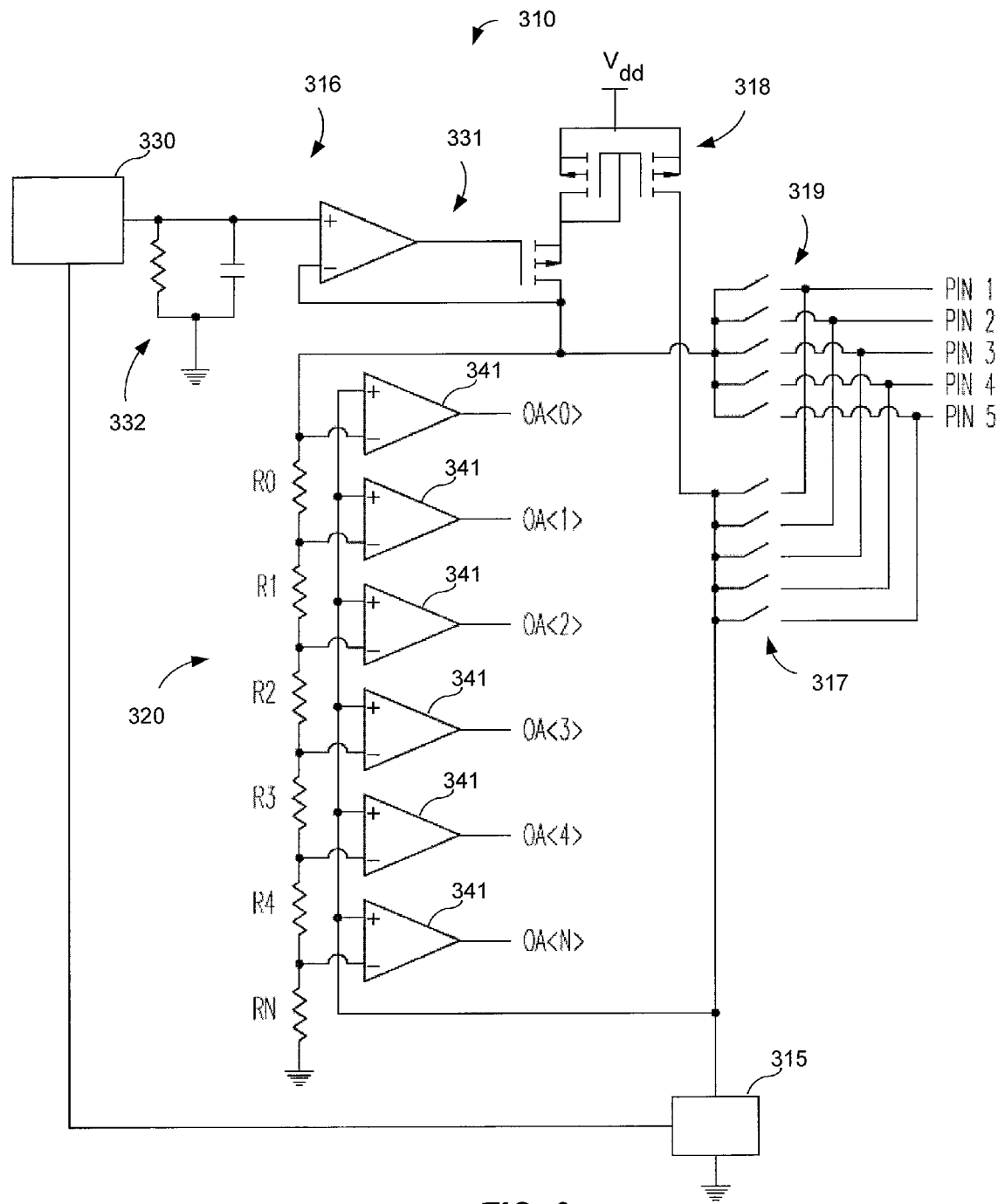
FIG. 3 illustrates generally a circuit diagram of a multiple accessory jack detection apparatus according to one example of the present subject matter.

FIG. 3 illustrates generally a circuit diagram of a multiple accessory detection apparatus according to one example of the present subject matter. The multiple accessory detection apparatus 310 includes a first reference generator 316, a second reference generator 318, a first plurality of switches 317, and a comparator circuit 320. Various embodiments include an optional second plurality of switches 319 and an optional offset circuit 315. The second plurality of switches 319 can allow, among other things, detection of pin-to-pin relationships of an accessory device (not shown). The offset circuit 315 can, among other things, limit current when testing for shorted pins and offset a test signal when detecting an accessory device impedance. Offsetting the test signal can, in some cases, provide a more accurate measure of impedance or other measurement.

The first reference generator 316 can include a digital-to-analog converter (DAC) 330, such as a 12-bit DAC. The DAC receives information from a controller to generate a reference waveform. For some detection methods, the waveform can be substantially a steady-state voltage. In some detection methods, the waveform can be a shaped voltage waveform. A shaped waveform can be used to detect impedance characteristics of an accessory device. The shaped waveform can also be used to reduce "clicking" and "popping" sounds during the detection process. For example, if an unknown accessory device includes speakers, such as speakers used in earpieces, a sudden voltage or current spike applied during an accessory detection routine can generate annoying "clicking" and "popping" sounds. Shaped reference waveforms generated by the first reference generator 316 can reduce annoying "clicking" and "popping" sounds. In some examples, the first reference generator 316 includes a voltage regulator 331 to maintain a voltage at a first input of the comparator circuit. In some examples, the output of the first reference generator is coupled to a pin of an accessory device through a multi-pin connector and a switch of the second plurality of switches 319. In such examples, the voltage regulator can maintain the voltage of the reference signal 322 applied to the input of the comparator circuit while also requesting additional current to supply the accessory device, if necessary. In various examples, the first reference generator 316 includes a filter 332 to smooth signal changes to reduce "clicking" and "popping" sounds. Such signal changes include signal changes due to a single bit change of the DAC 330.

The second reference generator 318 can be selectively coupled to pins of an accessory device through the multi-pin connector and one or more switches of the first plurality of switches 317. The second reference generator 318 can include a current mirror to supply the current requested by the first reference generator for the reference signal and to generate a test signal 324 that mirrors the current of the reference signal. The output of the second reference generator 318, the test signal 324, can be coupled to a second input of the comparator circuit. The test signal 324 can include a sum of currents including the mirrored current of the reference signal 322 and the current passing through the accessory device from the first reference generator 316 via the first plurality of switches 317 and a second plurality of switches 319.

The comparator circuit 320 can provide information indicative of a comparison between the voltage of the reference signal 322 at a first input of the comparator circuit and the voltage of the test signal 324 at the second input of the comparator circuit. In various examples, an output OA<0> . . . OA<N> of the comparator circuit 320 includes a digital signal indicative of the comparison.

The comparator circuit 320 can include a voltage divider $R_O \ldots R_N$ coupled between an output of the first reference generator 316 and ground. The comparator circuit 320 can further include one or more comparators 341, each comparator including a first input coupled to the reference signal 322 along the voltage divider. Each of the comparators 341 can include a second input coupled to the test signal 322. The output of the comparator circuit 320 can include the outputs of the one or more comparators to form a digital output indicative of the comparison of the test signal voltage with the various voltages generated from the reference signal using the voltage divider.

In some examples, the multiple accessory detection apparatus 310 includes an optional offset circuit 315. The offset circuit can include a DAC implemented as a variable current sink. The offset circuit 315 can receive information from the controller, or the first reference generator 316, and can divert a predetermined current (e.g. a predetermined current) from the test signal 322. In some example detection methods, the offset circuit 315 limits current passed through the pins of the accessory device, for example when detecting shorted pins or a diode coupled between pins. When detecting impedance, the offset circuit can divert current to offset the voltage of the test signal 324 at the second input of the comparator to a value closer to middle of the sensing range of the comparator voltage divider.

In various examples, the multiple accessory detection apparatus 310 can be coupled to a controller of an electronic device. The controller can initiate the various detection routines and receive the comparator output information to identify a connected accessory device. In some examples, the multiple accessory detector apparatus 310 can include a dedicated controller.

Figure 4:
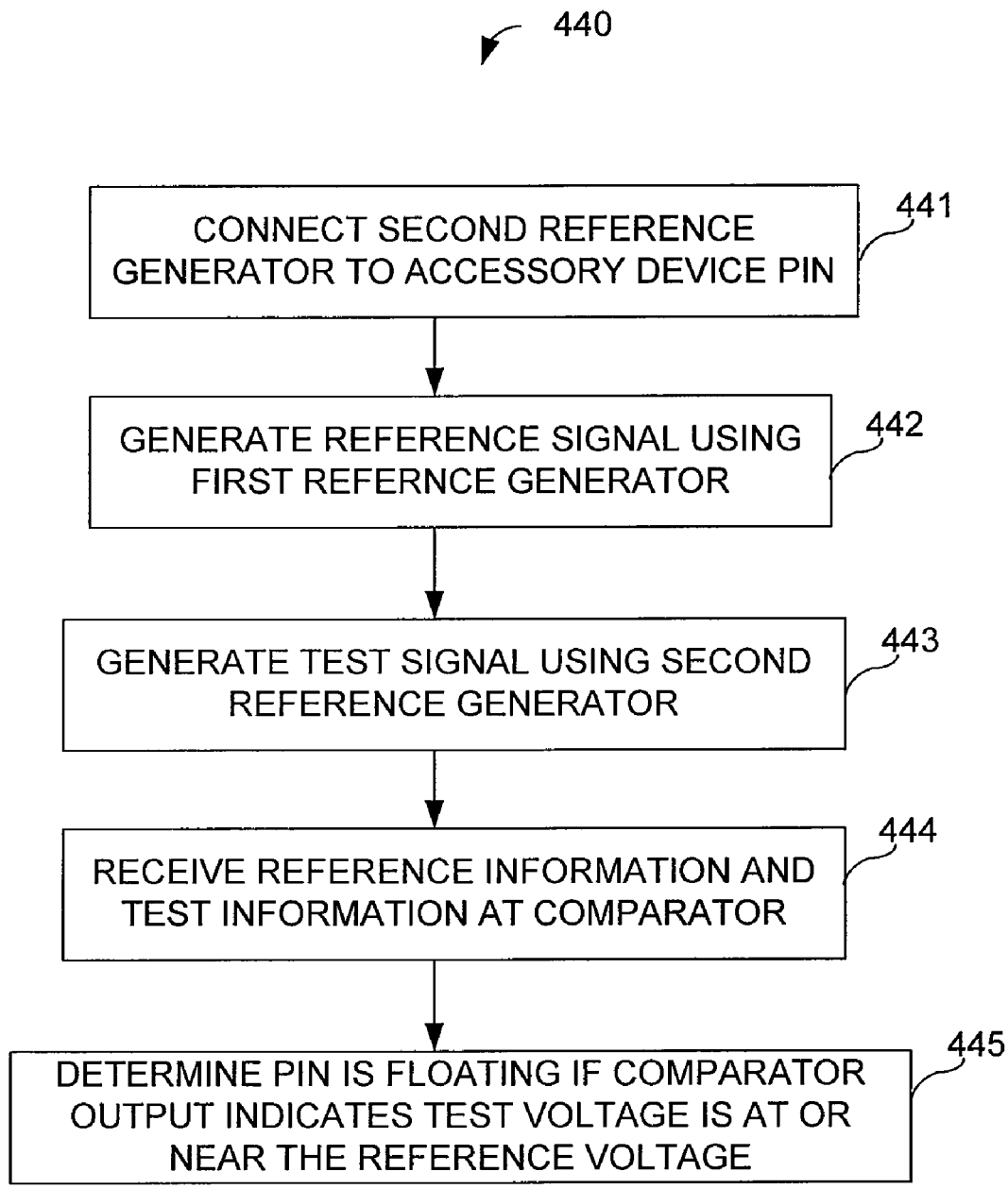
FIG. 4 illustrates generally a method for detecting a floating pin of an accessory device using accessory jack detection apparatus according to one example of the present subject matter.

FIG. 4 illustrates generally a method 440 for detecting a floating pin of an accessory device using multiple accessory detection apparatus according to one example of the present subject matter. The method 440 can include closing a switch to connect a pin of the accessory device to a second reference generator of the multiple accessory detection apparatus at 441, generating a reference signal from the first reference generator at 442, generating a test signal from the second reference generator using the reference signal at 443, receiving reference information from the reference signal and test information from the test signal at a comparator of the multiple accessory detection apparatus at 444, and determining the pin is floating if the output of the comparator indicates the voltage of the test signal is at or near the voltage of the reference signal at 445.

Referring to the multiple accessory detection apparatus of FIG. 3, in an example method, the reference signal can be set to about $V_{dd}/2$. The voltage regulator 331 can provide the current to maintain the voltage at the output of the first reference generator at $V_{dd}/2$. The current required can depend on the total resistance of the voltage divider of the comparator circuit 320. The second reference generator 318 can mirror the current of the reference signal if necessary. The test signal voltage can tend to remain at or near $V_{dd}$ unless current is diverted through the accessory device.

Referring to the circuit of FIG. 3, if current is diverted through the accessory device, the voltage of the test signal will lower. In an example, if the voltage remains above $V_{dd}/2$, all of the comparator outputs can remain high indicating the pin of the accessory device is floating. If the multiple detection circuit includes the optional offset circuit, the method can include setting the offset circuit to isolate the test signal from the system ground. In various examples, the method includes detecting a ground pin of the accessory device and connecting the ground pin to a system ground of the detection apparatus. In some examples, the ground of the accessory device is coupled to the system ground automatically when the connector of the accessory device is mated with the connector of the multiple accessory detection apparatus, for example, when the accessory device includes a USB connector. In some examples, the multiple accessory detection apparatus detects a ground pin of the accessory device.

Figure 5:
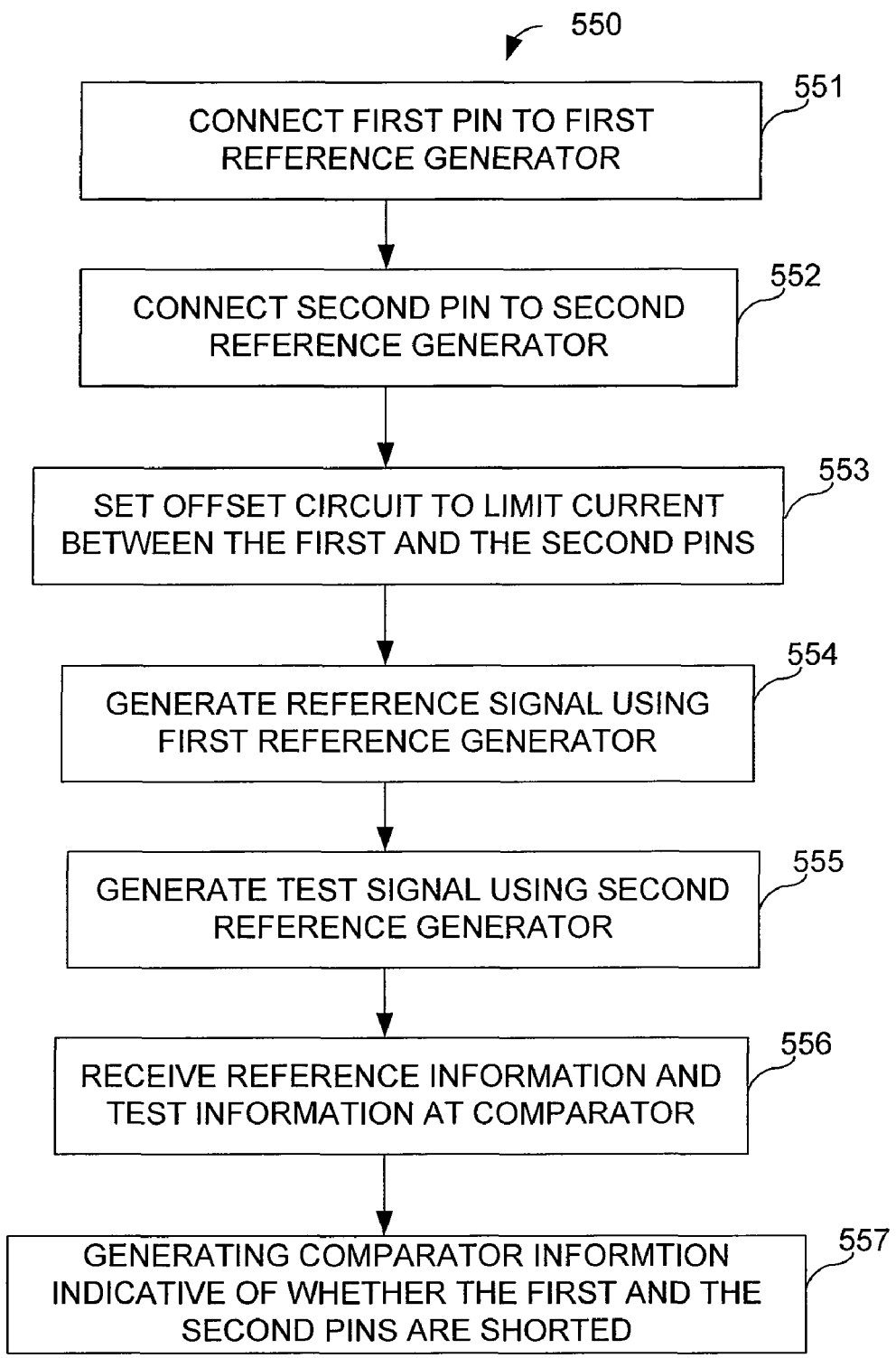
FIG. 5 illustrates generally a method for detecting a shorted pin of an accessory device using an accessory jack detection apparatus according to one example of the present subject matter.

FIG. 5 illustrates generally a method 550 for detecting shorted pins of an accessory device using a multiple accessory detection apparatus according to one example of the present subject matter. The method 550 can include closing a switch of a first plurality of switches to connect a first pin of the accessory device to the first reference generator at 551, closing a switch of a second plurality of switches to connect a second pin of the accessory device to the second reference generator at 552, setting the offset circuit to limit the current between the first and second pins at 553, generating a reference signal from the first reference generator at 554, generating a test signal from a second reference generator using the reference signal at 555, receiving reference information from the reference signal and test information from the test signal at a comparator of the multiple accessory detection apparatus at 556, generating comparator information indicative of whether the pins are shorted using the reference information and test information at 557. For example, the first reference generator can generate a 600 mV signal. In some examples, a 600 mV signal is used to distinguish a short circuit from a diode connected between two pins of the accessory device. The second reference generator can include a current mirror and can mirror the sum of the current flowing through the first pin of the accessory device and the current entering a first input of the comparator. An offset circuit can limit the short circuit current between the first and second pins of the accessory device to about 100 microamperes. If the pins are shorted, the voltage drop across the pins of the accessory device can be small compared to the voltage drop across the offset circuit.

Referring to the circuit of FIG. 3, in various examples, if all of the outputs of the comparator circuit are on except for output OA<0>, the output of the comparator circuit can indicate that the pins of the accessory device are shorted together. It is understood that other reference voltages and current limits are possible to detect shorted pins of the accessory device without departing from the scope of the present subject matter. As used herein, references to a first pin and a second pin are relative. For example, a first pin may be pin 3 on the multi-pin connector. A second pin can then be any other pin other than pin 3 on the multi-pin connector, unless a second pin is noted as the same pin as the first pin.

Figure 6:
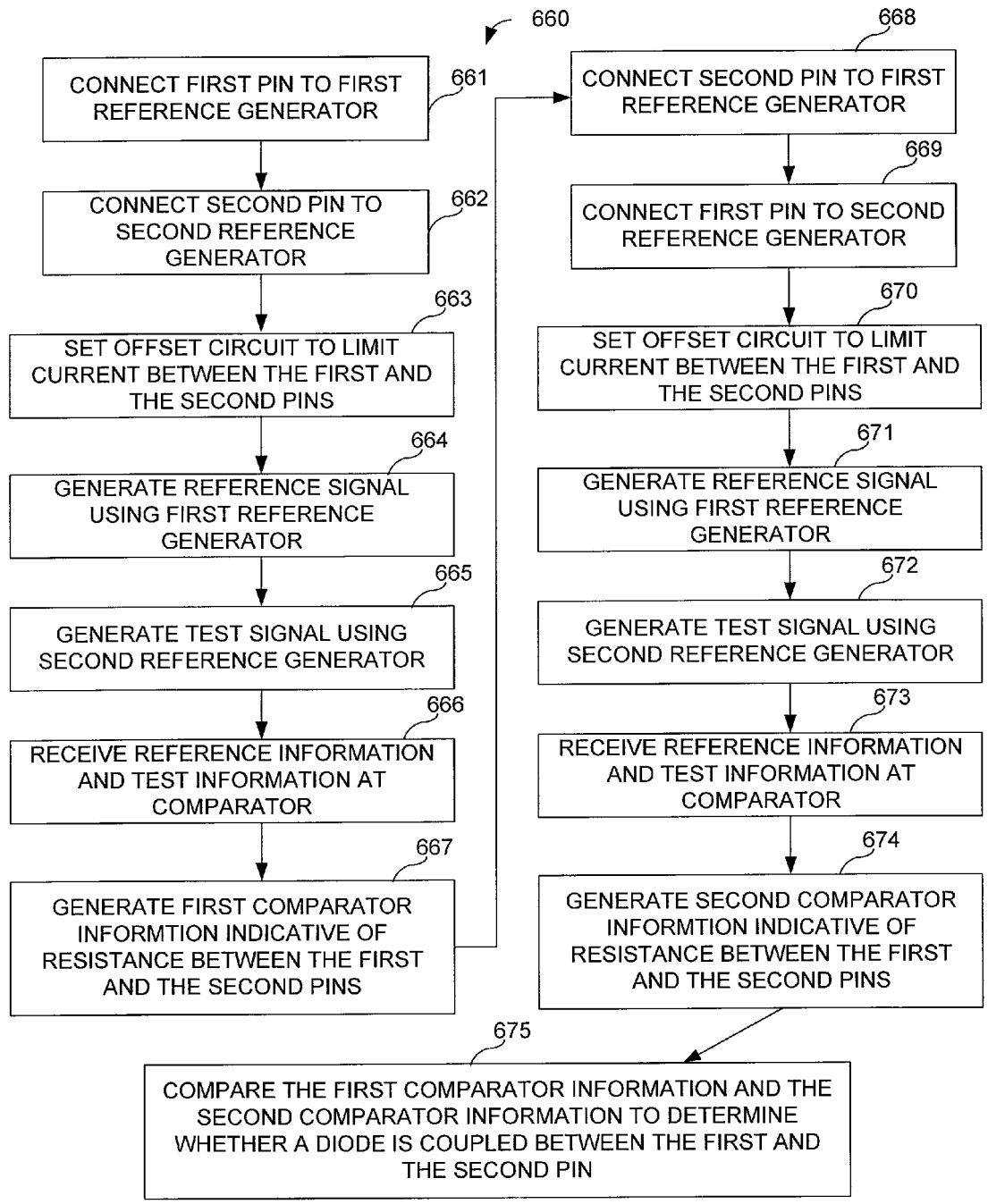
FIG. 6 illustrates generally a method for detecting polarity of a diode coupled one or more pins of an accessory device using an accessory jack detection apparatus according to one example of the present subject matter.

FIG. 6 illustrates generally a method 660 for detecting a diode, and the polarity of the diode, coupled between pins of an accessory device using a multiple accessory detection apparatus according to one example of the present subject matter. The method 660 can include closing a first switch of a first plurality of switches to connect a first pin of the accessory device to a first reference generator at 661, closing a first switch of a second plurality of switches to connect a second pin of the accessory device to the second reference generator at 662, setting the offset circuit to limit the current between the first and second pins at 663, generating a reference voltage using the first reference generator at 664, generating a test signal from a second reference generator using the reference signal 665, receiving reference information from the reference signal and test information from the test signal at a comparator of the multiple accessory detection apparatus 666, and generating a first output indicative of the resistance between the first and second pin using the reference and test information 667. The method 660 can then reverse the polarity of the reference signal to the accessory pins. For example, the method further includes closing a second switch of the first plurality of switches to connect the second pin of the accessory device to the first reference generator at 668, closing a second switch of the second plurality of switches to connect the first pin of the accessory device to the second reference generator at 669, setting the offset circuit to limit the current between the first and second pins at 670, generating a reference voltage from the first reference generator at 671, generating a test signal from a second reference generator using the reference signal at 672, receiving reference information from the reference signal and test information from the test signal at a comparator of the multiple accessory detection apparatus at 673 and generating a second output indicative of the resistance between the first and second pin using the reference and test information at 674. The method further includes comparing the first and second recorded outputs to determine if a diode is coupled between the first and second pins of the accessory device at 675. If a diode is connected between the first and second pins of the accessory device, the first and second recorded output of the comparator can be used to determine the polarity of the diode. For example, a controller can determine a diode is coupled between a first and second pin of an accessory device if the first recorded output of the comparator indicates a high resistance between the first and second pins, and the second recorded output indicates substantially a short circuit between the first and second pins. In such a scenario, the first recorded comparator circuit output can be lower than the second comparator circuit output because the first comparator output can show a large voltage drop across the diode when reversed bias and the second comparator output can show a small voltage drop across the diode when forward biased. A controller of the electronic device can determine whether a diode is connected between the first and second pin of the accessory device using these comparator outputs. Further, the diode can be determined to be connected such that a cathode of the diode is coupled to the first pin and an anode of the diode is coupled to the second pin. In an example, the first reference generator can generate a 1V signal. The 1V signal can forward bias a typical diode but not provide enough potential to overcome the breakdown voltage. The second reference generator can include a current mirror and can mirror the sum of the current entering the first pin and the current entering a first input of the comparator. The test signal can also sum the current passing through the accessory device from the first pin to the second pin. An offset circuit can limit current between the first and second pins of the accessory device to 1 A, for example. In various examples, the first reference generator can shape the reference signal to reduce any "clicking" or "popping" should the accessory device include a speaker.

Figure 7:
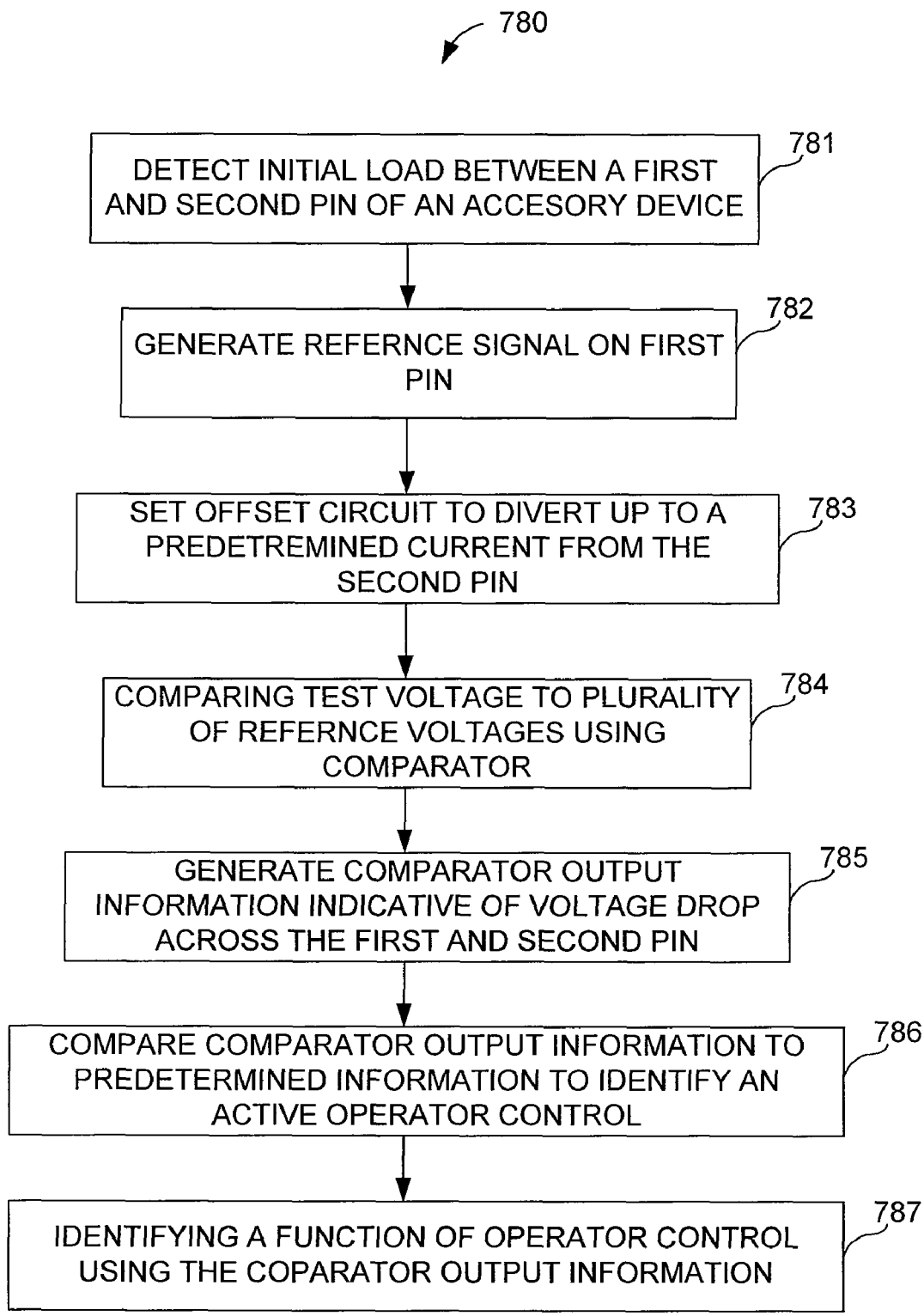
FIG. 7 illustrates generally a method for detecting a button coupled one or more pins of an accessory device using an accessory jack detection apparatus according to one example of the present subject matter.

FIG. 7 illustrates generally a method 780 for detecting activation of an operator control of an accessory device using a multiple accessory detection apparatus according to one example of the present subject matter. For example, an accessory device can include a pushbutton. Upon activation of the pushbutton, the load between two pins can change from an initially detected load. The method 780 can use a multiple accessory detection circuit according to the present subject matter to monitor a load for changes that indicate operation of a user control of the accessory device. The method 780 can include detecting an initial load of the accessory device at 781, generating a reference signal including a steady state voltage on a first pin of the multi-pin connector at 782, diverting up to a predetermined amount of current from a second pin of the multi-pin connector using a offset circuit at 783, and comparing the voltage across the offset circuit with a plurality of different voltages generated from the reference signal using the comparator circuit at 784, generating comparator output information indicative of the voltage drop across the operator control of the accessory device at 785, and comparing the output information to predetermined information to identify if an operator control is active at 786 and if so identifying the function of operator control using the comparator output information at 787. For example, when no key is pressed, very little current will flow between the first pin and the second pin. When a small current flows, it can be diverted through the offset circuit causing a large voltage drop across the offset circuit. The comparator can compare the voltage drop across the offset circuit to a plurality of voltages generated through a voltage divider coupled to the reference signal. Each of the plurality of voltages generated through the voltage divider can be coupled to a first input of a comparator, such as an op-amp comparator. The second input of each of the comparators can be coupled to the offset circuit.

Referring to the circuit of FIG. 3, the second input can include the positive input of the comparator and the first input can include the negative input of the comparator. Thus, the output of each comparator can go high when the voltage drop across the offset circuit exceeds the voltage of the voltage divider at the first input of the comparator. Where the button of the accessory indicates a high resistance, a small voltage can develop between the pins of the multi-pin connector compared to a large voltage drop across the offset circuit. Thus, in one example, all the outputs of the comparator circuit can be high when the operator control of the accessory is not activated. When an operator control, such as a pushbutton, is activated, the resistance between the pins will drop and a smaller voltage drop can develop across the offset circuit, thus, one or more of the comparator outputs can become low, indicating a state change of the accessory operator control. Some accessory devices can include a number of operator controls. In some examples, when none of the operator controls are active, all the outputs of the comparator circuit can be high. When a first operator control is activated, one or more first outputs of the comparator circuit can go low. The outputs indicate a first resistance between the pins of the multi-pin connector. When a second operator control is activated, a second one or more outputs of the comparator can go low. The second one or more outputs indicate a second resistance between the pins of the multi-pin connector. If each of the operator controls presents a different resistance between pins of the multi-pin connector, the detection apparatus can provide a unique output indicating the individual activation of each operator control.

Figure 8:
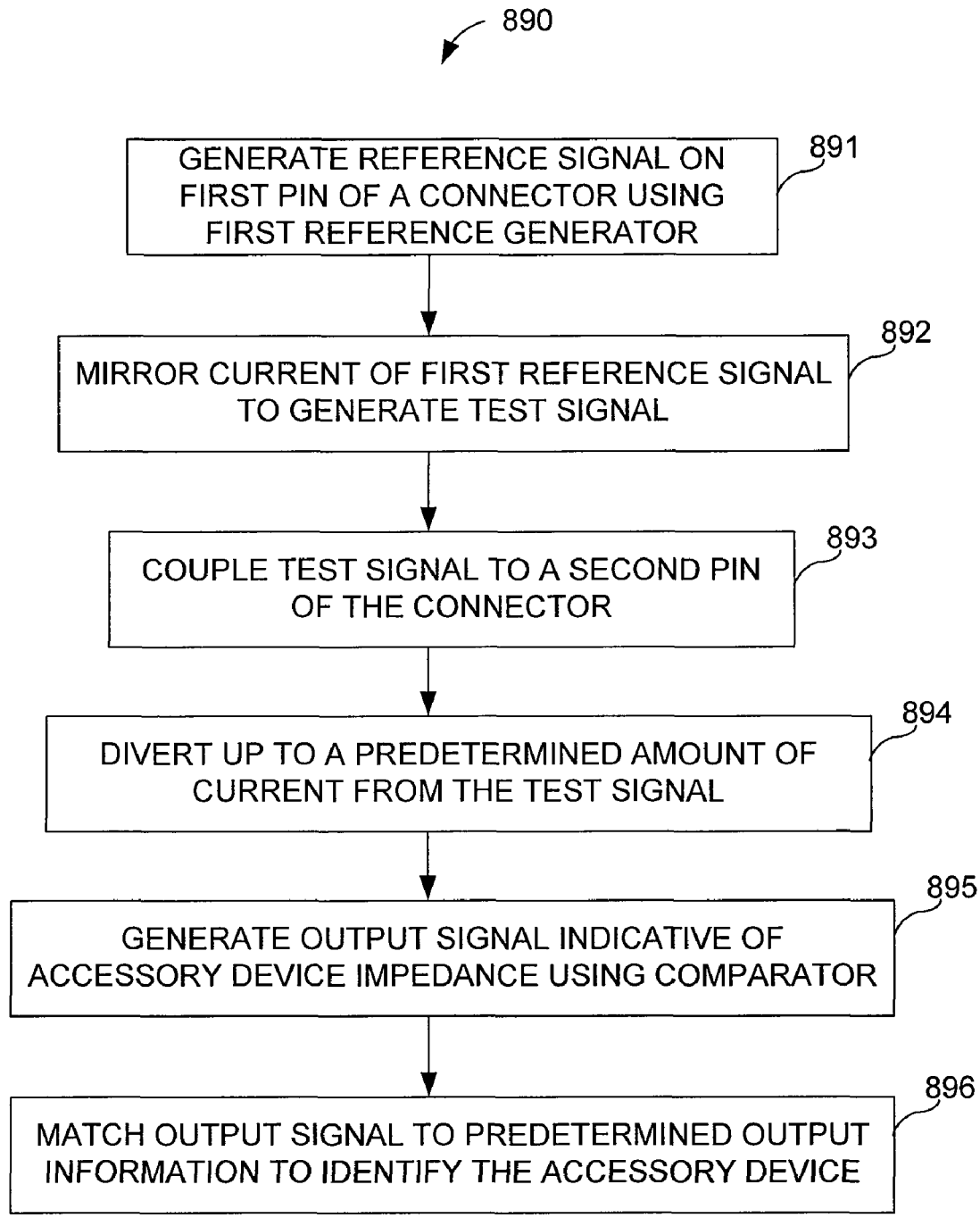
FIG. 8 illustrates generally a method for detecting impedance coupled to one or more pins of an accessory device using an accessory jack detection apparatus according to one example of the present subject matter.

FIG. 8 illustrates generally a method 890 for detecting impedance coupled to one or more pins of an accessory device using a multiple accessory detection apparatus according to one example of the present subject matter. The method 890 can include applying a reference signal to a first pin of a multi-pin connector at 891, mirroring the current of the reference signal to generate a test signal at 892, coupling the test signal to a second pin of the multi-pin connector at 893, the second signal including the mirrored current and the current of the reference signal passing through both the accessory device and a second pin of the multi-pin connector, diverting up to a predetermined amount current from the test signal at the offset circuit at 894, generating an output indicative of the impedance of the accessory device between the first and second pins using a comparator circuit at 895, matching the output signal information to predetermined output information to identify the accessory device at 896. The method 890 can be repeated one or more times using various reference waveforms to identify an accessory device. In various examples, each waveform can be associated with an expected output response of the comparator circuit when the connected accessory device includes an anticipated impedance. For example, the reference signal and the offset current of the offset circuit can be predetermined for a particular accessory device. If the particular accessory device is coupled to the multi-pin detector, the comparator circuit generates an anticipated output confirming the accessory device matches the expected impedance of the particular accessory device. In such examples, an electronic device can include one or more predetermined parameters associated with detecting one or more particular accessory devices. The parameters can define the reference signal waveform, the predetermined current offset of the offset circuit, and the expected output of the comparator circuit. In various examples, the electronic device can execute a number of impedance detection cycles before matching the coupled accessory device coupled to one of the particular accessory devices represented by the stored parameters. In various examples the reference signal and the test signal are controlled to reduce "clicking" or "popping" sounds if an accessory device includes a speaker receiving the first or test signal.

Figure 9A:
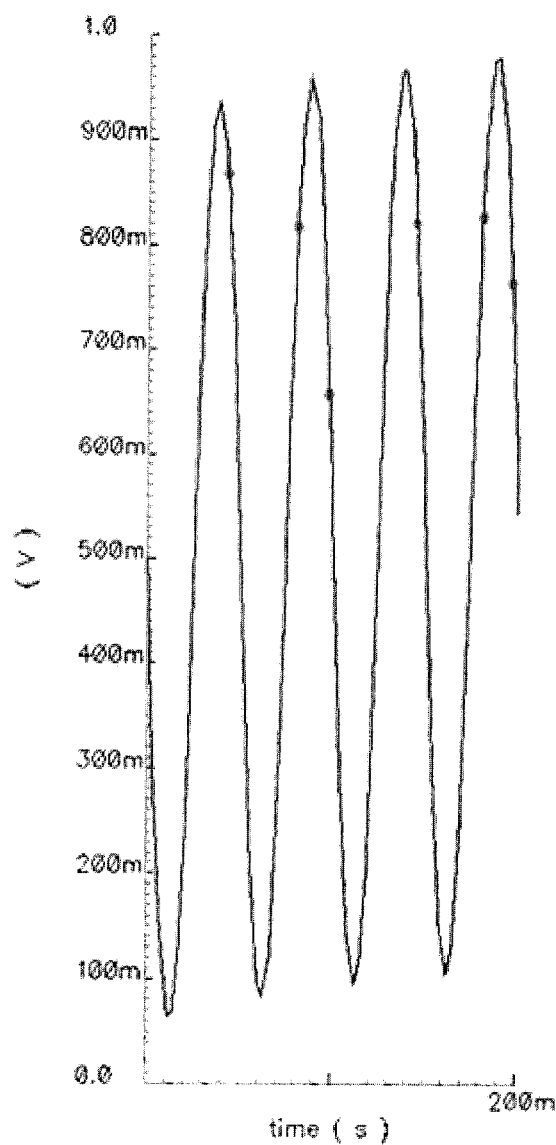
FIGS. 9A-9D illustrate various signal information from an impedance detection method according to an example of the present subject matter.
Figure 9B:
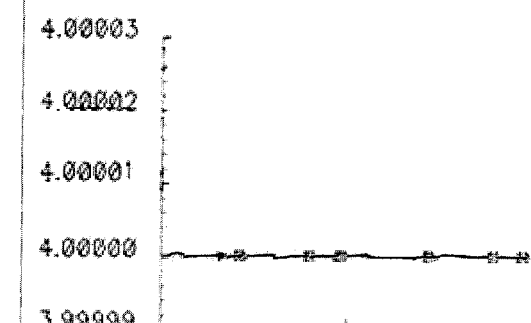
Figure 9C:
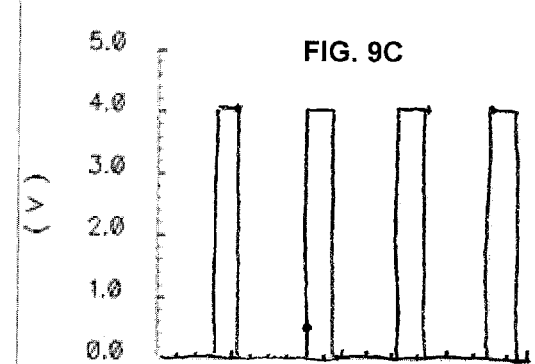
Figure 9D:
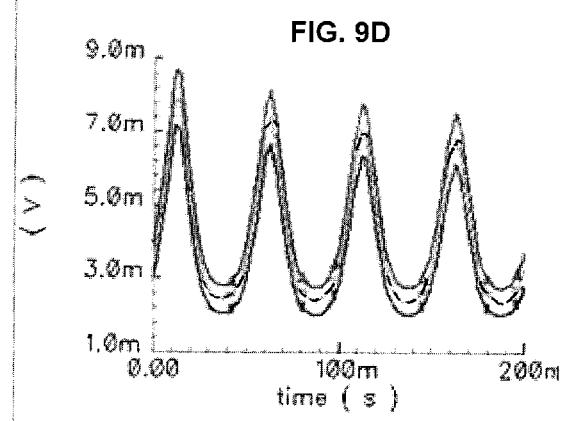

FIGS. 9A-9D illustrate various signal information from an impedance detection method according to an example of the present subject matter. FIG. 9A illustrates generally a reference signal generated using the first reference generator. The signal is shaped and varies between about 100 mV and 1 V. FIG. 9B illustrates generally two output bits at one extreme of the comparator circuit. The two output bits remain high during the detection method. FIG. 9D illustrates generally three bits at the other extreme of the comparator circuit. The three bits remain low (<10 mV) during the impedance detection method. FIG. 9C shows a middle bit of the comparator circuit that toggles between high and low in response to the reference signal. In an example, the combined response of the comparator circuit output is compared to an expected response for a particular device. The accessory device is identified if the actual response matches the expected response of the particular device.

In various examples, as part of an impedance detection protocol, a multiple detection apparatus according to the present subject matter can detect a resistance value between pins of a multi-pin connector of a connected accessory device. A resistance value can provide a unique identifier for an accessory device such that once the value is measured, an electronic device can configure electronics to efficient utilize the components of the accessory device. In detecting resistance, the first reference waveform can include a steady state voltage. The offset circuit can be configured to divert current such that particular resistance values of the accessory device will trigger predefined output values of the comparator circuit. Detecting a particular resistance value of an accessory device can identify the accessory device such that the electronic circuit can configure the electronics associated with the multi-pin connector to properly interface with the components of the accessory device.

ADDITIONAL NOTES

The above detailed description includes references to the accompanying drawings, which form a part of the detailed description. The drawings show, by way of illustration, specific examples in which the invention can be practiced. These examples are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other examples can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed example. Thus, the following claims are hereby incorporated into the Detailed Description, with each claim standing on its own as a separate example. The scope of the invention should be determined with reference to the appended claims, along with the full scope of legal equivalents to which such claims are entitled.

What is claimed is:

1. A system comprising:
an accessory device; and
an electronic device including:
a multi-pin connector configured to couple with the accessory device;
an accessory detection apparatus including:
a reference circuit configured to generate a reference signal;
a first plurality of switches coupled to the multi-pin connector, wherein each switch of the first plurality of switches is configured to couple a pin of the multi-pin connector to a test signal;
a current source configured to receive the reference signal and to generate the test signal using the reference signal; and
a comparator circuit coupled to the reference circuit, the comparator circuit configured to generate information about the accessory device using reference information received from the reference signal and test information received from the test signal; and
a controller configured to identify the accessory device using the generated information and to configure the electronic device to interface with the accessory device.

2. The system of claim 1, wherein the electronic device is selected from a group including at least one of a portable media player, a cell phone, a personal digital assistant (PDA), a computer, or an appliance.

3. The system of claim 1, wherein the accessory device includes at least one of a speaker, an earpiece, a microphone, a video display, or an operator control.

4. An apparatus comprising:
a reference circuit configured to generate a reference signal;
a first plurality of switches coupled to a multi-pin connector, wherein each switch of the first plurality of switches is configured to couple a pin of the multi-pin connector to a test signal, and wherein the multi-pin connector is configured to couple with an accessory device;
a current source configured to receive the reference signal and to generate the test signal using the reference signal; and
a comparator circuit coupled to the reference circuit, the comparator circuit configured to generate accessory information about the accessory device using the reference signal and the test signal.

5. The apparatus of claim 4, wherein the reference circuit includes a waveform generator.

6. The apparatus of claim 5, wherein the waveform generator includes a digital-to-analog converter.

7. The apparatus of claim 4, wherein the comparator circuit includes a plurality of resistive loads coupled in series between the reference circuit and ground.

8. The apparatus of claim 7, wherein the comparator circuit includes a plurality of comparators, each comparator having a first input coupled between at least one resistive load of the plurality of resistive loads and a second input configured to receive test information from the test signal.

9. The apparatus of claim 8, wherein the plurality of comparators are configured to output a digital signal including the accessory information.

10. The apparatus of claim 4, wherein the accessory information is indicative of a floating pin of the multi-pin connector.

11. The apparatus of claim 4, wherein the accessory information is indicative of an impedance between pins of the multi-pin connector.

12. The apparatus of claim 4, wherein the accessory information is indicative of a electrical short between pins of the multi-pin connector.

13. The apparatus of claim 4, wherein the accessory information is indicative of a diode coupled between pins of the multi-pin connector.

14. The apparatus of claim 4, wherein the accessory information is indicative of activation of a user interface device of the accessory device.

15. The apparatus of claim 4, wherein the multi-pin connector includes a tip-ring-sleeve (TRS) connector.

16. The apparatus of claim 4, wherein the multi-pin connector includes a Universal Serial Bus (USB) connector.

17. A method comprising:
generating a reference signal;
generating a test signal using the reference signal;
providing the test signal to a first pin of a multi-pin connector;
providing the reference signal and the test signal to a comparator circuit; and
generating, using the comparator circuit, an output signal using reference information from the reference signal and test information from the test signal, the output signal indicative of one of a plurality of electrical conditions of the multi-pin connector.

18. The method of claim 17, wherein the generating the output signal includes comparing the reference signal and the test signal using a plurality of comparators coupled to a voltage divider.

19. The method of claim 17, wherein the generating the output signal includes generating an output signal indicative of a floating pin of an accessory device coupled to the multi-pin connector.

20. The method of claim 17, including the coupling the reference signal to a second pin of the multi-pin connector; and
wherein generating the output signal includes generating an output signal indicative of an impedance of an accessory device coupled to the multi-pin connector.

21. The method of claim 17, wherein the generating the reference signal includes generating a shaped waveform to reduce audible interference if an accessory device coupled to the multi-pin connector includes a speaker.

22. The method of claim 21, wherein the generating the shaped waveform includes generating a sine wave.

23. The method of claim 21, wherein the generating the shaped waveform includes generating a bell shaped waveform.

24. The method of claim 17, including diverting a predetermined current of the test signal to a system ground using an offset circuit.

* * * * *